Figure 1:
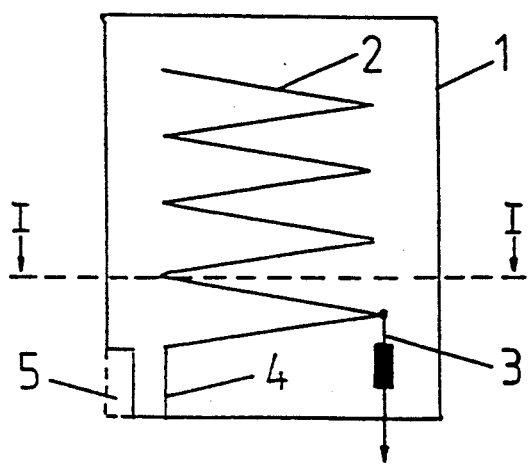

United States Patent [19]

Karsikas

[11] Patent Number: 5,210,510
[45] Date of Patent: May 11, 1993

[54] TUNABLE HELICAL RESONATOR

[75] Inventor: Auvo Karsikas, Kempele, Finland

[73] Assignee: LK-Products Oy, Kempele, Finland

[21] Appl. No.: 644,039

[22] Filed: Jan. 22, 1991

[30] Foreign Application Priority Data

Feb. 7, 1990 [FI] Finland .................................. 900611

[51] Int. Cl.⁵ .............................................. H01P 7/00
[52] U.S. Cl. ..................................... 333/219; 333/235
[58] Field of Search ............... 333/202, 219, 235, 174, 333/176, 178, 253

[56] References Cited

U.S. PATENT DOCUMENTS

| | | | |
|---|---|---|---|
| 3,159,803 | 12/1964 | Czubiak et al. | 333/230 |
| 3,622,891 | 11/1971 | Leland | 455/286 |
| 3,624,515 | 11/1971 | Rezek et al. | 455/150.1 |
| 3,691,487 | 9/1972 | Yoshimoto | 333/212 X |
| 3,825,862 | 7/1974 | Koizumi | 333/231 |
| 4,210,884 | 7/1980 | Tabuchi et al. | 333/219 X |
| 4,365,221 | 12/1982 | Vizmuller | 333/202 |
| 4,385,279 | 5/1983 | Meador | 333/235 |
| 4,682,131 | 7/1987 | May | 333/202 |
| 5,047,739 | 9/1991 | Kuokkanen | 333/219 |

FOREIGN PATENT DOCUMENTS

| | | |
|---|---|---|
| 0441513 | 1/1991 | European Pat. Off. . |
| 1108753 | 6/1961 | Fed. Rep. of Germany . |
| 58-3401 | 1/1983 | Japan . |
| 0206701 | 8/1989 | Japan .................................... 333/202 |
| WO83/00584 | 2/1983 | PCT Int'l Appl. . |
| 0847484 | 9/1960 | United Kingdom ................. 333/212 |

Primary Examiner—Robert J. Pascal
Assistant Examiner—Seung Ham
Attorney, Agent, or Firm—Banner, Birch, McKie & Beckett

[57] ABSTRACT

The invention relates to a helix resonator used in particular in filters operating at radio frequency. In instances in which conventional procedures based on adjusting the resonance frequency are not sufficient for tuning the resonator, the procedure of the invention can be used in which the resonator is tuned by adjusting the distance of the ground plane (the wall of the resonator cover (1)) from a leg (4) of the resonator or a lead (3), usually a micro strip, with which the resonator has been connected to an external circuit or to another resonator.

23 Claims, 3 Drawing Sheets

TUNABLE HELICAL RESONATOR

The present invention relates to tuning a helix resonator.

The use of a helical resonator as a circuit element is well known in the art, and it is widely used in filters of a high frequency range, in particular at 100 to 1000 MHz. Such resonators comprise inductive elements which are a helically wound coil and a metallic cover surrounding said coil at a distance. The low-impedance (grounded) end of the coil may be directly coupled to the metal cover. In practice, this takes place in that a wire to be wound into a helical coil is at this end straight for some length and positioned so as to be approximately rectangularly to the end face of the resonator cover, whereby a first cycle of the helical coil is consequently at a length from said straight leg from the end face of the cover. The opposite, high-impedance end of the coil is in proximity of the cover, being capacitively coupled thereto. The resonator can be connected electrically to the rest of the filter circuit either so that the low-impedance end is not connected to the cover; instead, a connecting lead insulated from the cover is connected thereto, or that at certain point of the helical coil is soldered a connecting lead which, being insulated from the cover, is taken outside said cover. This point of connection determines the impedance level of the resonator, therefore, by selecting said point the resonator can be matched with the rest of the circuit. This kind of matching in which the point of connection constitutes a tap from the helical coil is called tapping, and said point is called a tapping point. The tapping point may be determined by testing or calculation, being usually in a first cycle of the coil. The resonance frequency of the helix resonator is the function of the physical dimensions of the coil, the capacitive construction, and of the distance between the high-impedance end and the cover. Therefore, for obtaining a resonator of a given frequency range, an accurate and exact construction is required in manufacturing the same.

From the Finnish patent No. 78198 is known a helix resonator in which the helical coil has been supported with an insulating plate, whereby in one part of the insulating plate is positioned an electrical circuit formed from micro strips, to which the resonator has been electrically connected. The procedure of how to produce a helix resonator which is accurate concerning its tapping point and reproducible is described in the Finnish patent application No. 884953. The construction disclosed therein is partly the same as in the resonator disclosed in the Finnish patent No. 78198, with the exception that the micro strip is positioned at a given point of the surface of the insulating plate, whereby, when a coil is inserted to the insulating plate, it is always coupled to the same point of the micro strip. The micro strip can be taken out from the resonator directly or it may be connected to the electric circuit of an insulating plate disclosed in the Finnish patent No. 78198, said plate serving as a support.

In a filter utilizing helix resonators, one of such being e.g. duplex filter, tuning is required so as to make the filter to meet the requisite specifications. So far the tuning has taken place mainly by changing the frequencies of the resonators. For tuning the resonance frequency, a number of various methods are available, and therefore, the resonator can be provided with an adjusting element for tuning the frequency associated with the tuning of the product. Such adjusting elements are, for instance, capacitive adjusting elements, in which in the high-impedance coil terminates in a small metal plate or equivalent, this parallelling with the end face of the cover, though at a space therefrom. The end of the cover is provided with a screw, by turning which from outside the distance between the metal plate and the screw can be affected, and thus the distributed capacitance of the resonator, and, consequently, the resonance frequency. Respectively, in inductive adjustment the metal slug within the coil is moved, thus affecting the inductance of the coil and therethrough, the resonance frequency.

However, it is not always possible to make the filter tuning succeed in the above adjusting procedures in order to meet the specifications, and therefore it has to be rejected. In this instance, the adjustment of tapping would be conceivable to enlarge the adjustment range of tuning, but since the tapping point is utterly difficult to produce to be adjustable, this kind of adjustment has not been made use of. Adjusting the bandwidth of the resonator has equally been so far near impossible, and in situations in which the bandwidth of resonators should be adjusted for tuning the filter, it has been mandatory to reject the resonator for want of adjusting methods. The number of rejections also raises manufacturing costs.

The present invention introduces a procedure in which the bandwidth of helix resonator can be increased or decreased in a simple manner, while a change in resonance frequency is only minimal and can be compensated using conventional methods.

The invention is characterized in that the distance of the ground plane from the straight leg of the low-impedance end of the coil or from a micro strip connected to the tapping point is adjustable.

The invention is based on the idea that the tapping point, that is, the point in the coil from which the coupling to the outside of the resonator is carried out is not changed; instead, the impedance of the resonator in the tapping point is changed by shifting the distance of the ground plane relative to the leg, or the impedance of the tapping point is changed by affecting the impedance the strip line sees from the tapping point towards the ground plane by changing the distance of the ground plane from the tapping point. By making the ground plane approach the leg, the electrical distance of the tapping point becomes shortened, that is, the tapping decreases. This reduces the bandwidth. When, instead, the distance of the ground plane is increased from the leg of the coil, the distance of tapping from the ground plane becomes greater and, at the same time, the bandwidth of the resonator increases. An equivalent phenomenon occurs when the distance of the ground plane to the micro strip coupled to the tapping point is changed. The adjustment of the ground plane distance is simply carried out so that, because the cover of the resonator is on the ground plane, the distance between the cover wall and the leg, or between the cover wall and the micro strip, is changed, for instance by urging the wall of the cover at the leg or the micro strip towards it or by punching a flange on the cover wall which can be bent in the direction of the leg or the micro strip, or away therefrom. A separate adjusting element on the ground plane may also be constructed, the distance of which from the coil leg or the micro strip can be shifted using a suitable tool.

Figure 2:
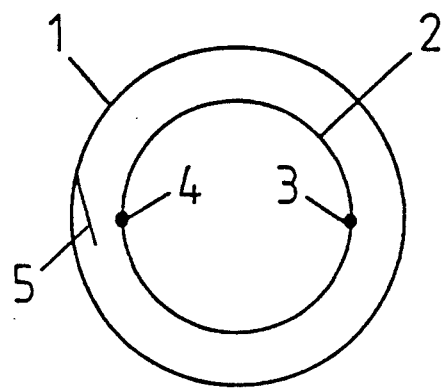
Figure 3:
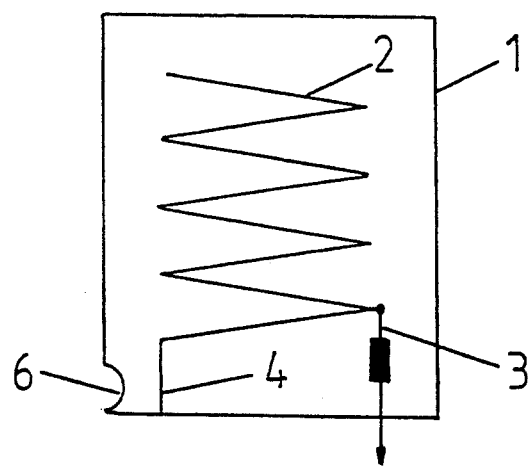
Figure 4:
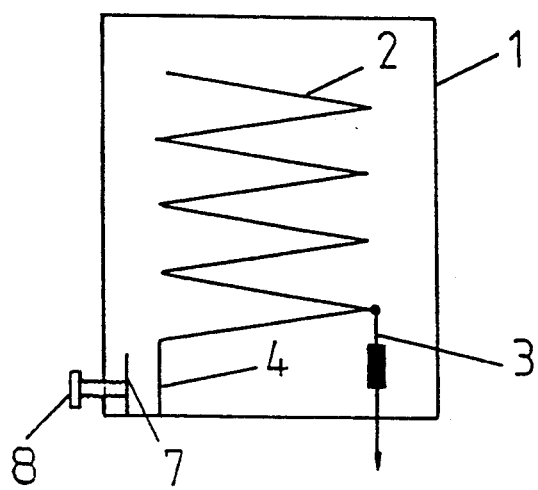
Figure 5:
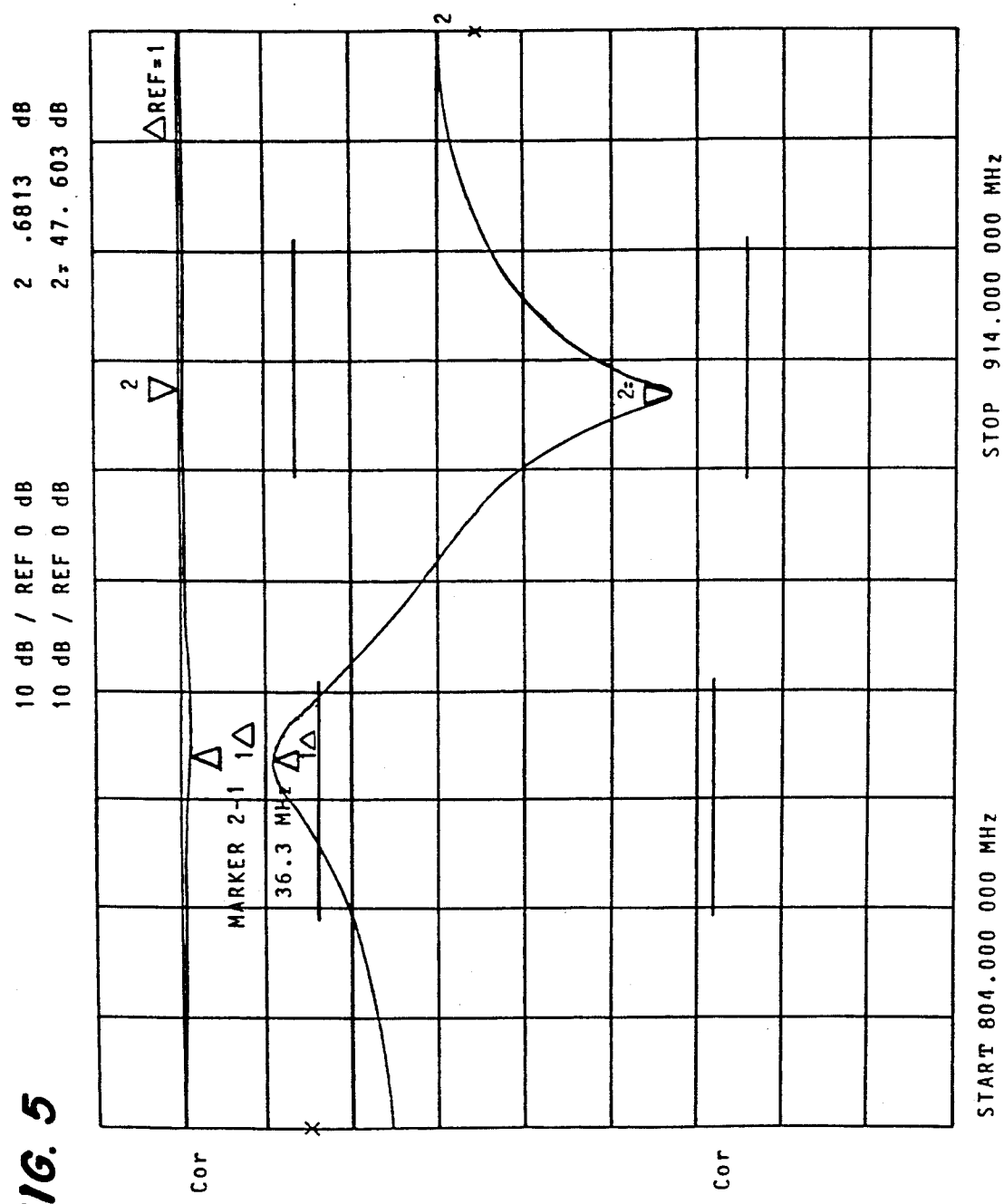
Figure 6:
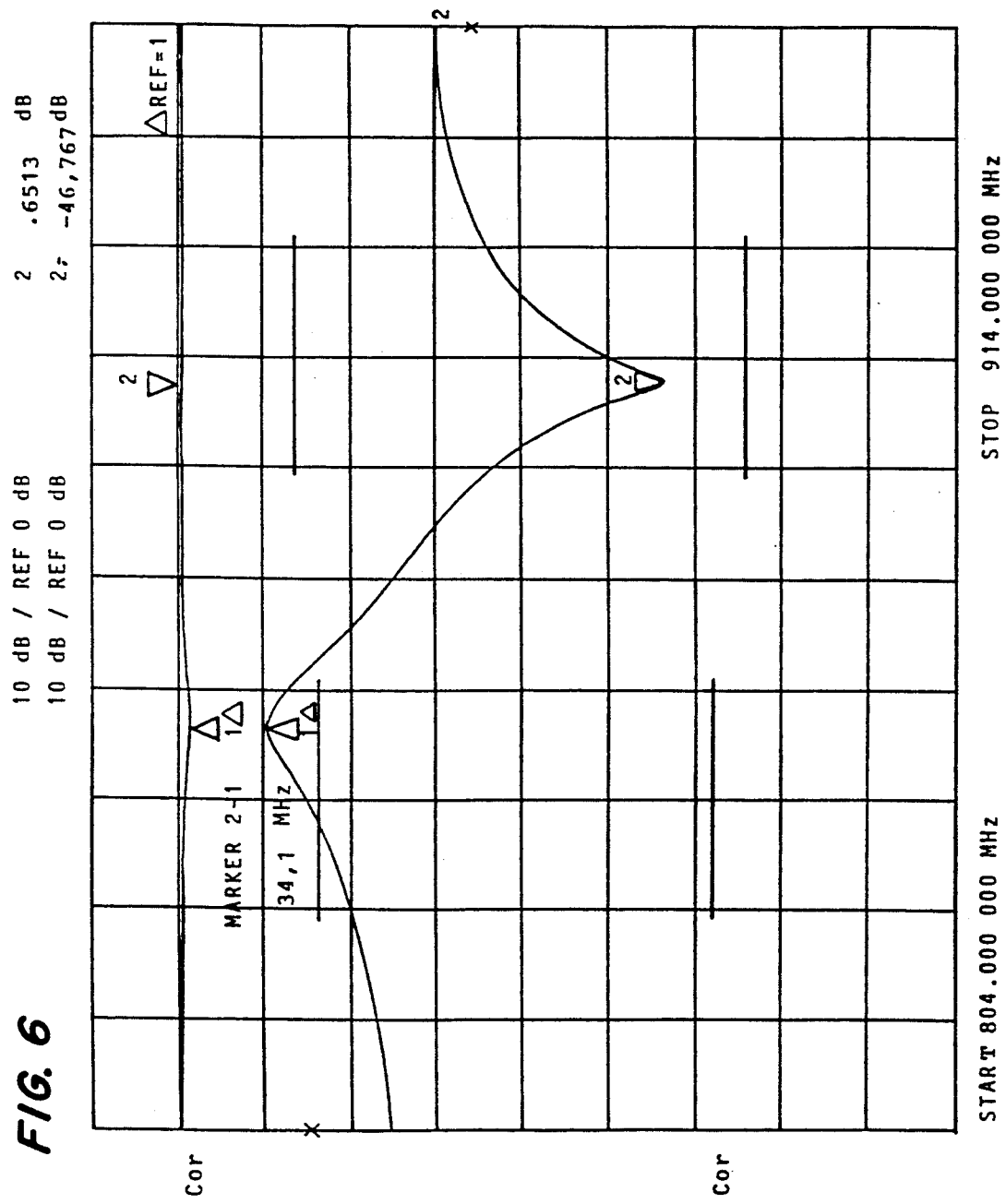

The invention is described in more detail using the adjustment between the ground plane and the resonator leg, and by referring to the accompanying drawings in which FIG. 1 presents a section of a resonator vertically, in which the adjusting element is a flange punched on a wall of the cover, FIG. 2 is a section of the resonator of FIG. 1 horizontally along line I—I, FIG. 3 is a section of the resonator vertically, in which the adjusting element is a cavity made on a wall of the cover, FIG. 4 is a section of the resonator vertically, in which a separate adjusting element is used, FIG. 5 is a duplex distance of the RX branch in a duplex filter before adjustment, and FIG. 6 is a duplex distance of the RX branch in a duplex filter after adjustment.

The resonator design of FIG. 1 comprises a cylindrical metallic or metal coated cover 1 which on all sides is encircled by a helically wound wire constituting the coil 2 of a helix resonator. The coil has been coupled at its so-called low-impedance end to the end of the cover 1 through a straight portion of the coil comprising the leg 4 of the resonator. Coupling with the rest of the vicinity is provided by a lead 3 soldered to the coil 2, which may be a micro strip connected to the electrical circuit of an insulating plate (not shown) used for supporting the coil. This kind of system is called tapping. At the upper end, that is, at the high-impedance end, the coil 2 is open and forms a capacitive coupling at the end of the resonator cover. As mentioned above, the coil 2 can be supported with an insulating plate placed thereinside, which in turn has been supported to the cover 1, or the support may also be arranged in another way. The cover 1 of the resonator may, in fact, be rectangular in cross-section, or of some other shape, and likewise a plurality of resonator coils may be positioned within a common elongated cover, these being separated by metallic partitions. All different constructions are possible in conjunction with the present invention, and they are in no way limiting the invention. When the resonator is connected to electrical circuit, its cover 1 is grounded. On the resonator cover 1, on its lower part opposite to the leg 4, is punched, e.g., a U-shaped incision, one edge of which can be joined with the lower edge of the cover 1. A flange 5 is herewith produced which can be bent when tuning the resonator, as shown in FIG. 2, towards the leg 4 using an appropriate tool, such as screwdriver. Since the flange 5 has been formed from the wall of the grounded cover 1, by adjusting the distance of the flange 5 from the leg 4 the distance of the ground plane from the leg is adjusted, and herewith the impedance is affected at the tapping.

An alternative embodiment is shown in FIG. 3. As can be seen therein, the distance of the ground plane from the leg 4 of the resonator is adjusted by making a depression 6 with a suitable tool on the wall of the resonator cover 1 at the leg 4. The wall may at said point be reduced so that the depression 6 can be produced more easily only by pressing. Since the coil is totally closed, a marking can be made with a coloring agent etc. on the wall at the deformation point, so that the depression can be pressed at the right point. In this embodiment it is very difficult to make the depth of the depression just right.

A third embodiment is presented in FIG. 3. A separate adjusting element 7 is used therein, which can be a metal sheet or a metal thread positioned in the direction of the leg 4. The adjusting element 7 has been attached to the tool 8, such as screw, which passes through the aperture made in the wall of the cover 1 at the leg 4. By turning the screw the distance of the sheet or thread 7 from the leg 4 can be adjusted, and because the sheet or thread has been grounded through the tool 8, the electrical characteristics of the tapping are thus affected. Thus, with this adjusting element, a highly accurate adjustment is achieved. In a simple form the adjusting element 7 may comprise a sole screw 8 of a sufficient thickness. Said alternative is in addition to FIG. 1 preferable because it is inexpensive and easy to provide in manufacturing the cover 1.

In the above-described manner, the tuning characteristics of the helix resonator can be considerably increased in comparison with the present designs. In particular the design in which the adjusting element is a flange punched from the wall of the resonator cover is non-complicated, low in costs and advantageous as regard its manufacturing technique. By the method of the invention, the tapping point may therefore be changed in both directions, that is, by taking the grounded adjusting element closer to the resonator leg, the tapping reduces and the characteristic impedance of the resonator increases at the tapping point. As a result of this, the bandwidth diminishes. Similarly, by taking the adjusting element further from the leg, the tapping increases. It has been shown experimentally that the adjustment method of the invention affects the bandwidth of the resonator of the order of several MHz, depending on the frequency range.

FIG. 5 shows a measurement result of a duplex distance of the RX branch in a duplex filter when resonators not provided with the adjustment opportunity of the invention are used. At the transmission frequency, the attenuation is required to be small, while at the receiving frequency it is expected to be large, and the interspace between the transmission direction peaks and the attenuation peaks is required to conform to the specifications prescribed. In the present example, the duplex interval should be as close to 34 MHz as possible. It is seen in the figure that when using conventional methods, it has been possible with the components used to obtain a duplex interval of 36.3 MHz.

When the adjustment of the distance between the ground plane and the leg of the resonator coil of the invention is used, the duplex interval obtained is, as in FIG. 6, easily and rapidly 34.1 MHz, which is enough. Hereby, it is not necessary to reject the filter, as would be the case if conventional helix resonators were used.

The procedure of the invention is applicable in association with any type of helix resonators which are provided with tapping or a straight leg portion in the coil. The same principle is also applicable to such instances in which the distance of the ground plane is adjusted from another point towards the external circuit from the tapping point, for instance from a component of an electric circuit placed on an insulating plate used for supporting the resonator.

I claim:

1. A tunable helical resonator comprising:
    a helical coil having a first end, a second end and a lead coupled to the helical coil between the first and second end;
    a covering encircling the helical coil, so that the first end of said helical coil is connected to the cover and the second end being free and at a first distance from the cover; and an adjusting element formed in the cover which can be adjusted to vary a second distance between the adjusting element and the first end of the helical coil, the second distance between the adjusting element and the first end of the helical coil, the second distance being perpendicular to the longitudinal axis of the helical coil, wherein the adjusting element is a depression formed in the cover adjacent to the first end of the helical coil and protruding towards the first end.

2. A helical resonator according to claim 1, wherein a thickness of the cover at the adjusting element is less than the thickness of the cover elsewhere.

3. A helical resonator according to claim 1, wherein a location of the adjusting element is marked on the cover.

4. A tunable helical resonator comprising:
a helical coil having a first end, a second end and a lead coupled to the helical coil between the first and second end, the first end having a portion oriented parallel with a longitudinal axis of the helical coil;

a cover encircling the helical coil, so that the first end of said helical coil is connected to the cover and the second end being free and at a first distance from the cover; and an adjusting element formed in the cover adjacent to the portion of the first end of the helical coil oriented parallel to the longitudinal axis of the helical coil which can be adjusted to vary a second distance between the adjusting element and the portion of the first end of the helical coil.

5. A helical resonator according to claim 4, wherein the adjusting element is a flange formed in the wall of the cover adjacent to the lead coupled of the helical coil.

6. A helical resonator according to claim 4, wherein the adjusting element is a depression formed in the cover adjacent to the lead coupled to the helical coil, protruding towards the lead.

7. A helical resonator according to claim 6, wherein a thickness of the cover at the adjusting element is less than the thickness of the cover elsewhere.

8. A helical resonator according to claim 6, wherein the adjusting element is a metal sheet positioned adjacent to the lead coupled to the helical coil, the second distance being between the metal sheet and the lead coupled to the helical coil and being adjustable by a screw.

9. A helical resonator according to claim 4, wherein the adjusting element is a screw penetrating the cover adjacent to the lead coupled to the helical coil, the second distance being between the screw and the lead coupled to the helical coil and being adjustable by turning said screw.

10. A helical resonator according to claim 4, wherein a location of the adjusting element is marked on the cover.

11. A helical resonator according to claim 4, wherein the adjusting element is a rod penetration adjacent to the lead coupled to the helical coil, the second distance being between the rod and the lead and being adjustable by pushing or pulling the rod.

12. A variable bandwidth helical resonator comprising:
a housing having a cavity;

a helical coil having a first end and a second end, the coil formed within the cavity of the housing so that the first end of the coil being connected to the housing;

a lead coupled to the helical coil between the first end and the second end for setting an impedance level of the resonator; and bandwidth adjusting means for adjusting the bandwidth of the resonator formed in the housing between a point adjacent to the lead coupled to the coil and the first end of the coil and protruding into the cavity toward the coil.

13. A turnable helical resonator comprising:
a helical coil having a first end, a second end and a lead coupled to the helical coil between the first and second end, the first end having a portion oriented parallel with a longitudinal axis of the helical coil;

a cover encircling the helical coil, so that the first end of said helical coil is connected to the cover and the second end being free and at a first distance from the cover; and an adjusting element formed in the cover which can be adjusted to vary a second distance between the adjusting element and the first end of the helical coil, wherein the adjusting element is a flange formed in the wall of the cover adjacent to the first end of the helical coil.

14. A tunable helical resonator comprising:
a helical coil having a first end, a second end and a lead coupled to the helical coil between the first and second end;

a cover encircling the helical coil, so that the first end of said helical coil is connected to the cover and the second end being free and at a distance from the cover; and an adjusting element formed in the cover which can be adjusted to vary a distance between the adjusting element and the first end of the helical coil, wherein the adjusting element is a depression formed in the cover adjacent to the first end of the helical coil and protruding towards the first end.

15. A tunable helical resonator comprising:
a helical coil having a first end, a second end and a lead coupled to the helical coil between the first and second end;

a cover encircling the helical coil, so that the first end of said helical coil is connected to the cover and the second end being free and at a distance from the cover; and an adjusting element formed in the cover which can be adjusted to vary a distance between the adjusting element and the first end of the helical coil, wherein the adjusting element is a depression formed in the cover adjacent to the first end of the helical coil and protruding towards the first end, and wherein a thickness of the cover at the adjusting element is less than the thickness of the cover elsewhere.

16. A tunable helical resonator comprising:
a helical coil having a first end, a second end and a lead coupled to the helical coil between the first and second end;

a cover encircling the helical coil, so that the first end of said helical coil is connected to the cover and the second end being free and at a distance from the cover; and an adjusting element formed in the cover which can be adjusted to vary a distance between the adjusting element and the first end of the helical coil, wherein the adjusting element is a depression formed in the cover adjacent to the first end of the helical coil and protruding towards the first end, and wherein the adjusting element is a metal sheet positioned adjacent to the first end of the helical coil, a distance between the metal sheet and the first end of the helical coil being adjustable by a screw.

17. A tunable helical resonator comprising:

a helical coil having a first end, a second end and a lead coupled to the helical coil between the first and second end, the first end having a portion oriented parallel with a longitudinal axis of the helical coil;

a cover encircling the helical coil, so that the first end of said helical coil is connected to the cover and the second end being free and at a first distance form the cover; and an adjusting element formed in the cover which can be adjusted to vary a distance second between the adjusting element and the lead coupled to the helical coil, wherein the adjusting element is a flange formed in the wall of the cover adjacent to the lead coupled of the helical coil.

18. A tunable helical resonator comprising:

a helical coil having a first end, a second end and a lead coupled to the helical coil between the first and second end;

a cover encircling the helical coil, so that the first end of said helical coil is connected to the cover and the second end being free and at a distance from the cover; and an adjusting element formed in the cover which can be adjusted to vary a distance between the adjusting element and the lead coupled to the helical coil, wherein the adjusting element is a depression formed in the cover adjacent to the lead coupled to the helical coil, protruding towards the lead.

19. A tunable helical resonator comprising:

a helical coil having a first end, a second end and a lead coupled to the helical coil between the first and second end;

a cover encircling the helical coil, so that the first end of said helical coil is connected to the cover and the second end being free and at a distance from the cover; and an adjusting element formed in the cover which can be adjusted to vary a distance between the adjusting element and the lead coupled to the helical coil, wherein the adjusting element is a depression formed in the cover adjacent to the lead coupled to the helical coil, protruding towards the lead, and wherein a thickness of the cover at the adjusting element is less than the thickness of the cover elsewhere.

20. A tunable helical resonator comprising:

a helical coil having a first end, a second end and a lead coupled to the helical coil between the first and second end;

a cover encircling the helical coil, so that the first end of said helical coil is connected to the cover and the second end being free and at a distance from the cover; and an adjusting element formed in the cover which can be adjusted to vary a distance between the adjusting element and the lead coupled to the helical coil, wherein the adjusting element is a depression formed in the cover adjacent to the lead coupled to the helical coil, protruding towards the lead, and wherein the adjusting element is a metal sheet positioned adjacent to the lead coupled to the helical coil, a distance between the metal sheet and the lead coupled to the helical coil being adjustable by a screw.

21. A tunable helical resonator comprising:

a helical coil having a first end, a second end and a lead coupled to the helical coil between the first end and second end;

a cover encircling the helical coil, so that the fist end of said helical coil is connected to the cover and the second end being free and at a first distance from the cover; and an adjusting element formed in the cover adjacent to the first end of the helical coil which can be adjusted to vary a second distance between the adjusting element and the first end of the helical coil, the second distance being perpendicular to a longitudinal axis of the helical coil, wherein the adjusting element is a metal sheet position adjacent to the first end of the helical coil, the second distance being between the metal sheet and the first end of the helical coil and being adjustable by a screw.

22. A tunable helical resonator comprising:

a helical coil having a first end, a second end and a lead coupled to the helical coil between the first end and second end;

a cover encircling the helical coil, so that the first end of said helical coil is connected to the cover and the second end being free and at a first distance from the cover; and an adjusting element formed in the cover adjacent to the first end of the helical coil which can be adjusted to vary a second distance between the adjusting element and the first end of the helical coil, the second distance being perpendicular to a longitudinal axis of the helical coil, wherein the adjusting element is a screw penetrating the cover adjacent to the first end of the helical coil, the second distance being between the screw and the first end of the helical coil and being adjustable by turning said screw.

23. A tunable helical resonator comprising:

a helical coil having a first end, a second end and a lead coupled to the helical coil between the first end and second end;

a cover encircling the helical coil, so that the first end of said helical coil is connected to the cover and the second end being free and at a first distance from the cover; and an adjusting element formed in the cover adjacent to the first end of the helical coil which can be adjusted to vary a second distance between the adjusting element and the first end of the helical coil, the second distance being perpendicular to a longitudinal axis of the helical coil, wherein the adjusting element is a rod penetrating the cover adjacent to the first end of the helical coil, the second distance being between the rod and the fist end of the helical coil and being adjustable by pushing or pulling the rod.

* * * * *